US009892771B2

(12) United States Patent
Palmer et al.

(10) Patent No.: US 9,892,771 B2
(45) Date of Patent: Feb. 13, 2018

(54) MEMORY CONTROLLER WITH DYNAMIC CORE-TRANSFER LATENCY

(71) Applicant: Rambus Inc., Sunnyvale, CA (US)

(72) Inventors: Robert E. Palmer, Chapel Hill, NC (US); William F. Stonecypher, Chapel Hill, NC (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/126,868

(22) PCT Filed: Mar. 24, 2015

(86) PCT No.: PCT/US2015/022221
§ 371 (c)(1),
(2) Date: Sep. 16, 2016

(87) PCT Pub. No.: WO2015/148488
PCT Pub. Date: Oct. 1, 2015

(65) Prior Publication Data
US 2017/0092343 A1 Mar. 30, 2017

Related U.S. Application Data

(60) Provisional application No. 61/970,521, filed on Mar. 26, 2014.

(51) Int. Cl.
*G11C 7/22* (2006.01)
*G11C 7/10* (2006.01)

(52) U.S. Cl.
CPC . *G11C 7/22* (2013.01); *G11C 7/10* (2013.01)

(58) Field of Classification Search
None
See application file for complete search history.

(56) References Cited

U.S. PATENT DOCUMENTS

| 5,428,649 A | 6/1995 | Cecchi |
| 5,557,769 A | 9/1996 | Bailey et al. |
| 6,930,955 B2 | 8/2005 | Johnson et al. |
| 8,099,564 B1 | 1/2012 | Kulkarni et al. |
| 2003/0131160 A1* | 7/2003 | Hampel .......... G11C 7/10 710/22 |

(Continued)

OTHER PUBLICATIONS

Notification Concerning Transmittal of International Preliminary Report on Patentability dated Oct. 6, 2016 re: Int'l Appln. No. PCT/US2015/022221. 6 Pages.

(Continued)

*Primary Examiner* — James G Norman
(74) *Attorney, Agent, or Firm* — Charles Shemwell (57) ABSTRACT

In a memory controller having a controller core and a physical signaling interface, the controller core outputs a request for read data to the physical signaling interface specifying one of at least two memory components from which the read data is to be retrieved. In response to the request for read data, the physical signaling interface outputs a memory read request to the specified memory component, receives the read data from the specified memory component, and transfers the read data to the controller core at either a first time or a second time according to whether the specified memory component is a first memory component or second memory component of the at least two memory components.

20 Claims, 6 Drawing Sheets

(56) References Cited

U.S. PATENT DOCUMENTS

2004/0218435 A1    11/2004  Takahashi et al.
2012/0173825 A1*    7/2012  Ehrlich ................. G06F 11/362
                                                        711/145
2016/0351245 A1*   12/2016  Kano .................. G11C 11/4076

OTHER PUBLICATIONS

PCT International Search Report and Written Opinion dated Jul. 2, 2015 in International Application No. PCT/US2015/022221. 13 pages.
Strano, Alessandro et al., "A Library of GALS Interfaces for Cost-Effective and Flexible MPSoC Design". In Transactions on HiPEAC, vol. 5, Issue 4, pp. 1-20, 2011. 20 pages.

\* cited by examiner

FIG. 5
Hold-Off Search
(Coarse)

FIG. 7
Drift Tracking

FIG. 6
Hold-Off Search
(Fine)

MEMORY CONTROLLER WITH DYNAMIC CORE-TRANSFER LATENCY

TECHNICAL FIELD

The present invention relates generally to the field of data processing and more particularly to data storage and retrieval.

BACKGROUND

Memory read operations in synchronous memory systems typically involve a timing domain crossing as read data received at the physical signaling interface of a memory controller (the "PHY") is transferred from logic operated in response to incoming strobe signals to a separately clocked, and thus different timing domain, memory controller core. This timing domain crossing from strobe domain to core-clock domain tends to be complicated by a number of factors, including the need to account for non-uniform strobe domains for different memory ranks (i.e., groups of memory devices that are selected as a unit to output read data onto respective slices of a data path in response to the same read command) as well as phase drift in a given strobe domain over time due to, for example, changes in voltage and temperature. In general, such timing variations are managed by levelizing the PHY-to-core read data transfer, delaying lower-latency transactions to match those of longer-latency transactions and to account for worst-case timing drift and timing jitter, thus enabling a rank-independent (and drift-independent) read-data latency from the perspective of the memory controller core.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In various memory controller embodiments disclosed herein, read-data transaction timing is tracked on a rank-by-rank basis and over changes in temperature and voltage to establish a time-varying and rank-specific read-data arrival time estimate. By applying the read-data arrival estimate to control the timing of the memory controller PHY-to-core read data transfer, the core-perceived read-data latency may be substantially reduced as compared with transaction levelizing approaches that enforce delays to match the worst case rank latency and/or worst-case drift, jitter, or other delay sources. In a number of embodiments, strobe tracking logic is provided within a memory controller PHY to generate an initial rank-specific read-data latency estimate and thereafter to adjust the estimate (producing a running read-data latency estimate) over time to produce a running (time-varying) read-data latency estimate. As discussed below in reference to FIG. 1, to enable the controller PHY to be combined with various different memory controller cores (e.g., as where the same controller PHY is sold, as an intellectual property cell, to various different ASIC manufacturers and thus is combined with cores of varying capability with respect to the PHY-to-core interface), the controller PHY is provided with configuration logic (e.g., one or more programmable registers or other run-time or production-time configurable circuitry) that enables operation in either a deterministic PHY-to-core read data timing mode, or a dynamic (low-latency) PHY-to-core read data timing mode.

Figure 1:
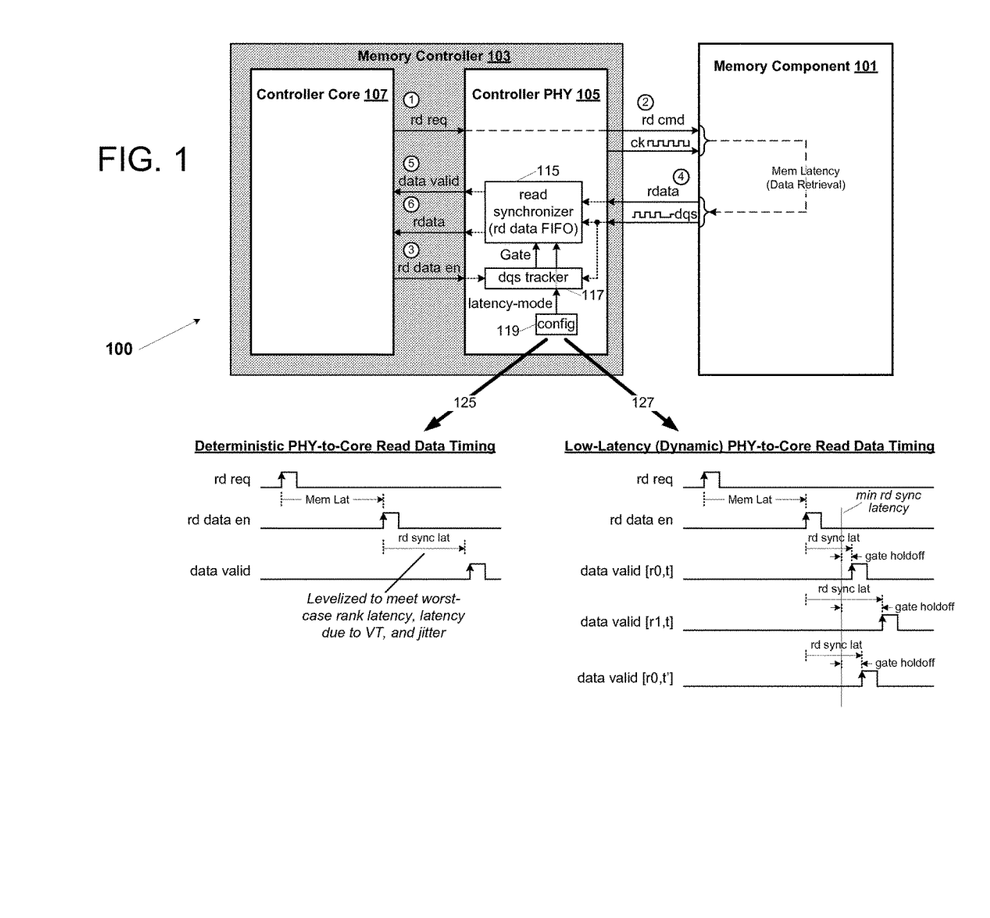
FIG. 1 illustrates an embodiment of a memory system having a memory component and a multi-mode memory controller.

FIG. 1 illustrates an embodiment of a memory system having a memory component 191 and multi-mode memory controller 103. Memory controller 103 includes a controller core 107 and controller PHY 105, with the controller PHY being configurable to operate in either a deterministic (fixed-latency) PHY-to-core read data timing mode or a low-latency (dynamic or time-varying) PHY-to-core read data timing mode. Referring to the enumerated operations shown, a memory read transaction begins with transmission of a read request (1) from controller core 107 to the controller PHY 105 to which the PHY responds by outputting a read command (2) to memory component 101. In the embodiment shown, the read command is conveyed synchronously with respect to a controller clock signal ("ck") with that clock signal being used, for example, as a timing reference to sample the read command within the memory component (or enable generation of one or more timing references within the memory component for that and/or other purposes) and to clock internal logic within the memory component. Though not specifically shown, the memory component itself includes a physical signaling interface, control logic and a memory core, with the latter formed by one or more arrays of virtually any type of memory cells including, for example and without limitation, dynamic random access memory (DRAM) cells, static random access memory (SRAM) cells, and various type of "non-volatile" memory cells, such as NAND and/or NOR flash memory cells, phase change memory, ferromagneto random access memory (FRAM), and so forth. Also, while a single memory component is shown, memory controller 103 may issue a single read command to multiple memory components configured in a "memory rank," in effect, operating the rank of memory components as a unit and instructing each of the memory components to output respective portions of a read data value. For example, in one embodiment, multiple ranks of memory components may be coupled to memory controller 103, with the memory components of each rank being coupled in common to a read command path and clock signal line (thus enabling each memory component in the rank to receive a given read command) and each memory component in the rank being coupled to memory controller 103 via a respective single-bit or multi-bit data path and a respective strobe line (or multiple strobe lines). In such an embodiment, memory controller 103 may select a particular rank of memory components for read or write access, for example and without limitation, by asserting a chip select signal on a rank-specific chip-select line that is coupled in common to all the memory components of that rank, thereby permitting those memory components (but not those of other memory ranks) to receive a controller-issued memory read or write command.

Continuing with FIG. 1, a predetermined time after issuing the read request to controller PHY 105, controller core 107 issues a read data enable signal (3) to prepare the PHY for reception of read data returned from memory component 101. In one embodiment, the time delay between controller core assertion of the read request and the read data enable signal is programmed within a configuration circuit of the controller core in accordance with a data retrieval latency of the memory component—a time, which may be measured in cycles of the clock signal (ck), including fractions thereof, and which reflects the interval between the memory component's receipt of the read command and output of the requested read data. For example, during system initialization, a memory latency value may be determined by reading a serial presence detect (SPD) or other non-volatile source of information that characterizes the memory component and thereafter programmed within a register of memory component 103 to establish a delay (e.g., in clock cycles or fractions thereof) in accordance with the data retrieval latency of the memory component latency. That same memory latency value may be used to program the timing offset, within the controller core, between assertion of the read request and read data enable signals.

Still referring to FIG. 1, after a memory latency interval sufficient to enable data retrieval from its memory core, memory component 101 transmits the requested read data ("rdata") to the memory controller as shown at (4), outputting a read-data timing strobe ("read strobe") to time reception of data within controller PHY 105 (i.e., "dqs"—a timing signal that transitions to signal read data transmission and, conversely, remains at a steady state during periods of non-transmission). A continuously toggling timing reference (i.e., clock signal) may be output to time read data reception in alternative implementations or the memory controller may include timing circuitry to synthesize a read data sample-timing reference internally (obviating chip-to-chip timing signal transmission). In the embodiment shown, the read data and read strobe are received within controller PHY 105 and supplied to a read synchronizer 115; a logic circuit that organizes read data in preparation for a transfer from controller PHY 105 to controller core 107 and, more specifically, from the timing domain established by the incoming read strobe to an internal timing domain of the controller core, referred to herein as the core clock domain.

Continuing with the embodiment of FIG. 1, controller PHY 105 includes a strobe tracking circuit 117 ("dqs tracker") that receives the read data enable signal from controller core 107 and the incoming read strobe signal and tracks the relative timing between those signals to generate a data-capture enable signal referred to herein as a "gate" signal (Gate) and to enable assertion of a data valid signal (5) and concomitant read data transfer (6) with a mode-specific timing relative to the gate signal assertion. More specifically, when a latency-mode value (e.g., a control value programmed within configuration circuit 119) indicates a deterministic PHY-to-core read data latency mode, strobe tracker 117 and read synchronizer 115 operate to achieve a fixed timing offset ("read synchronizer latency") between assertion of the read data enable and data valid signals, enabling incoming read data to propagate through a read data FIFO (i.e., within read synchronizer 115) for as long as necessary to levelize the PHY-to-core data transfer timing to meet the worst-case rank latency and worst-case latency due to voltage/temperature drift (and/or other environmental changes) and timing jitter. This timing arrangement is shown at 125. By contrast, when the latency mode signal indicates a dynamic PHY-to-core read data latency mode, strobe tracker 117 and read synchronizer 115 implement a time-varying, low-latency PHY-to-core data transfer timing, minimizing (or at least reducing) the read synchronizer latency according to the latency of the memory rank that transmitted the read data and expanding or contracting the read synchronizer latency over time for any particular rank according to environmentally induced phase drift (e.g., changes in the read data phase/read strobe phase due to changes in voltage and/or temperature). More specifically, as shown in the low-latency PHY-to-core read data timing diagram shown at 127, the strobe tracker and read synchronizer implement a time-varying gate-hold off interval (i.e., representing a time at which strobe tracker 117 asserts the gate signal relative to a nominal best-case memory latency) and enable the data valid signal to track the time-varying gate signal. By this arrangement, the read synchronizer latency changes dynamically for memory transactions directed to different memory ranks and also as the read transaction timing with respect to a given rank drifts over time (e.g., in response to changes in voltage/temperature). Thus, a data valid signal for a memory read transaction directed to rank 0 at time t (i.e., "data valid [r0, t]") is asserted after a relatively brief read synchronizer interval only slightly longer than a nominal minimum read synchronizer latency (marked by "gate holdoff"), whereas the data valid signal for a memory read transaction directed to rank 1 in roughly the same timeframe (i.e., "data valid [r1, t]") is asserted after a significantly longer read synchronizer latency as the gate holdoff interval is substantially longer for rank 1 than rank 0. Similarly, the data valid signal for another memory read transaction directed to rank 0 at later time t' ("data valid [r0, t']") exhibits a longer read synchronizer latency as the gate hold off interval has grown due to changes in voltage and temperature (the gate holdoff interval may also shrink so that the read synchronizer latency grows closer to or reaches the nominal minimum).

Figure 2:
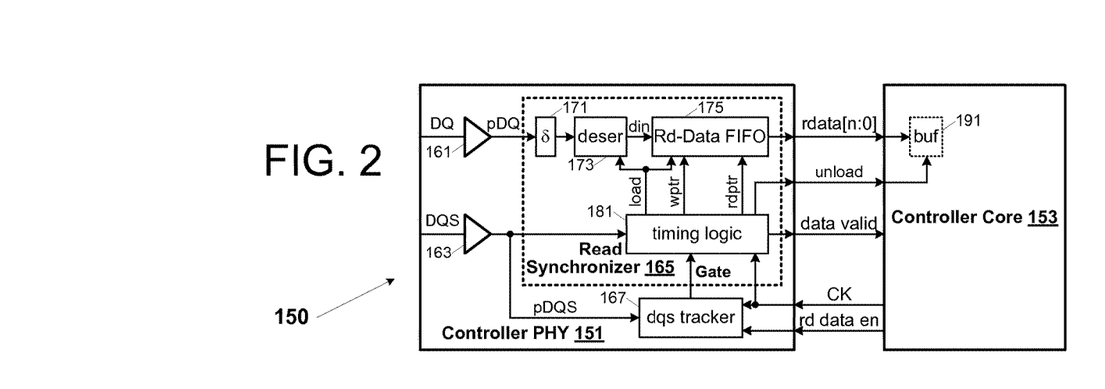
FIG. 2 illustrates a more detailed embodiment of a memory controller 150 having a controller PHY and controller core reoriented relative to their counterparts shown in FIG. 1 to present read data flow canonically from left to right.

FIG. 2 illustrates a more detailed embodiment of a memory controller 150 having a controller PHY 151 and controller core 153 reoriented relative to their counterparts shown in FIG. 1 to present read data flow canonically from left to right. As shown, controller PHY 151 includes amplifier/buffer circuits 161 and 163 to receive and level-convert incoming read data (DQ) and read strobe (DQS) signals. In one embodiment, for example, the amplifier buffer circuits convert small-swing signals (e.g., according to any number of signaling protocols including, without limitation, series-stub terminated logic (SSTL), pseudo open-drain signaling (PODS—also referred to as pseudo open-drain logic or PODL), low-voltage swing terminated logic (LVSTL), etc.) to logic-level signals (e.g., complementary metal-oxide-semiconductor (CMOS) signaling levels). Amplifier/buffer 163 may also include pull-down or pull-up circuitry to convert a parked strobe signal level to a low or high logic-level signal—an operation discussed below in connection with strobe tracking operation. Also, while a single DQ signal and amplifier/buffer are shown, multiple DQ inputs (e.g., two, four, eight, sixteen, or any other practical signal count) may be provided per read strobe input.

Still referring to controller PHY 151, signals output from the amplifier/buffer circuits 161 and 163 are denominated by a "pad" prefix, as in pad-DQ ("pDQ") and pad-DQS ("pDQS") to distinguish them from the DQ and DQS signals arriving at the external contacts of the controller PHY. Within an exemplary read synchronizer 165 shown in FIG. 2, read data signal pDQ propagates through delay element 171, producing a delayed data signal at the input of deserializer 173 which, in turn, outputs a deserialized (i.e., parallelized) data signal, "din" at the input of a first-in-first-out (FIFO) read-data storage buffer 175 ("read data FIFO). Data strobe signal pDQS is supplied to timing logic 181 within read synchronizer and also to a strobe tracker 167, with the latter outputting a time-varying gate signal to timing logic 181 generally as described in reference to FIG. 1. Timing logic 181 responds to the incoming pad-strobe (pDQS) and gate signal by asserting a sequence of load pulses to deserializer 173 and read-data FIFO 175, each pulse enabling production of a multi-bit deserialized data signal (din) within the deserializer and capture of the deserialized data signal within an available storage cell of the read-data FIFO. More specifically, timing logic 181 advances a write pointer as each new deserialized data value is loaded into read-data FIFO 175, thus effecting a sequence of FIFO load operations. Note that a slightly delayed version of the load signal may be generated to control load operations within the read-data FIFO, thus accounting for data setup time at the FIFO input. As discussed below in connection with the timing diagrams shown in FIGS. 8 and 9, the FIFO load pulses (and advancing of the write pointer) are timed relative to transitions of the incoming data strobe signal (e.g., having delayed offsets therefrom in accordance with a propagation delay through a pDQS-path counterpart to delay element 171) and thus represent operations carried out in the read-strobe timing domain.

In the embodiment of FIG. 2, timing logic 181 asserts a sequence of unload pulses to time the transfer of contents of read-data FIFO 175 to buffer logic 191 (e.g., implemented by one or more storage registers) within controller core 153. As explained below, the unload pulses are delayed in accordance with the gate signal assertion so that the net time delay between the controller core's initiation of a memory read operation and receipt of read data from the controller PHY (i.e., by virtue of the sequence of unload pulses) corresponds to the read transaction latency for the subject memory rank and the current timing state (i.e., VT-drift state) for that rank—a departure from conventional implementations that expand the read transaction latency perceived by the controller core to match the worst-case (longest/slowest) memory rank latency. Though dependent on gate-signal timing, the unload pulses are asserted synchronously with respect to the core clock signal so that the transfer from read-data FIFO 175 to controller core 153 constitutes a time domain crossing, from the read strobe domain in which the FIFO was loaded to the core clock domain in which the FIFO is unloaded. In one embodiment, timing logic 181 advances a read pointer value ("rptr") synchronously with respect to the core clock, starting one cycle prior to the first unload pulse to establish the initially loaded FIFO cell as the FIFO output and thereafter sequencing through the FIFO cells in order to effect first-in-first-out data delivery. Reflecting on this operation, it can be seen that read-data FIFO 175 need only be deep enough to provide tolerance for the read-strobe to core-clock domain crossing. Accordingly, in contrast to levelizing approaches that require a read-data FIFO deep enough (i.e., contain sufficient storage cells) to buffer data for a time period corresponding to the worst-case memory-rank latency (with additional depth to account for worst-case voltage/temperature drift and timing jitter), significantly fewer FIFO cells may be required within read-data FIFO 175 (unless deterministic PHY-to-Core read data timing modes are supported), reducing circuit footprint and power consumption.

Figure 3:
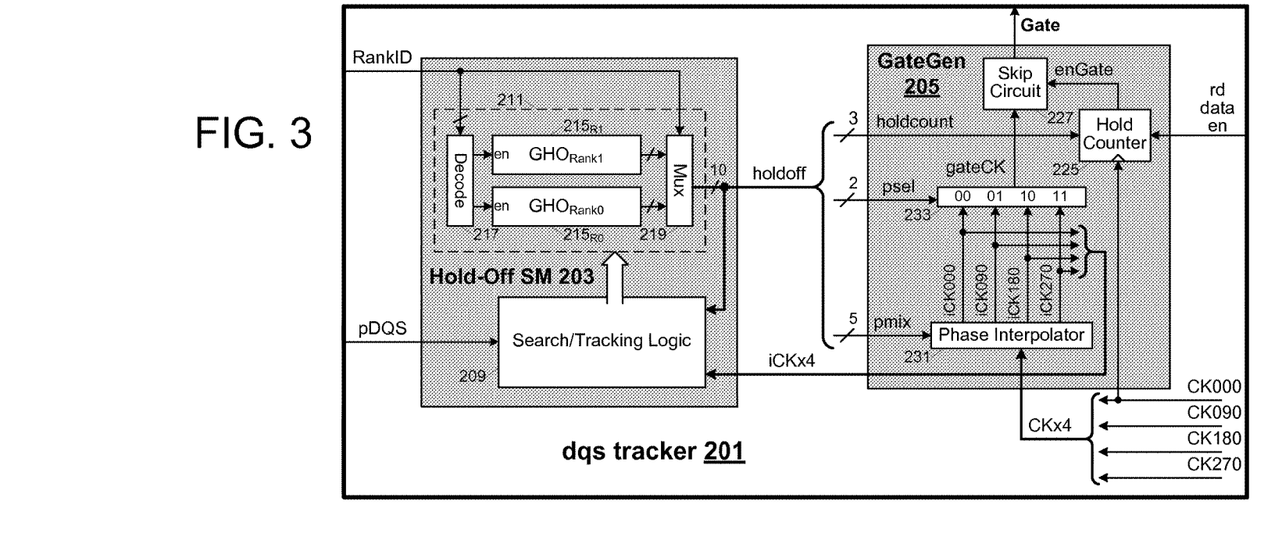
FIG. 3 illustrates an embodiment of a strobe tracking logic circuit that may be used to implement strobe tracker shown in FIG. 2.

FIG. 3 illustrates an embodiment of a strobe tracking logic circuit 201 ("strobe tracker" or "DQS tracker") that may be used to implement strobe tracker 167 of FIG. 2. In the example shown, strobe tracker 201 includes a hold-off state machine 203 and gate generator 205 (GateGen), receives the pad-strobe signal (pDQS), a rank identifier value (RankID), the read data enable signal, and a quadrature version of the core clock signal (i.e., four maximally phase-separated instances of the core clock, and thus individual core clock signals at nominal 0, 90, 180 and 270 degree phase angles within a core clock cycle) as inputs, and outputs the above-described gate signal. Hold-off state machine 203 itself includes a gate hold-off (GHO) register bank 211, and a search/tracking logic circuit 209. In one embodiment, gate hold-off register bank 211 includes a respective GHO register for each memory rank in the system (two memory ranks are assumed in the example shown, and thus two GHO registers ($215_{R0}$, $215_{R1}$) are provided, though more memory ranks may be accommodated in alternative embodiments) together with an enable decoder 217 and output multiplexer 219 that select a particular one of the GHO registers (collectively, 215) for update and gate-signal generation operations according to the memory rank specified by the incoming rank identifier (a value supplied, for example, by a transaction manager containing a queue of rank ID values ordered in accordance with a sequence of memory access operations initiated by the controller core).

In the embodiment of FIG. 3, the contents of GHO registers 215 constitute respective "holdoff" values representative of the gate hold-off state for each of the different memory ranks, so that, in effect, hold-off state machine 203 may be viewed as containing multiple state machines—one for each memory rank—that are enabled to be updated and to control operations with gate signal generator 205 at different times. As shown, search/tracking logic 209 receives the incoming pad-strobe signal (pDQS) together with the output of a rankID-selected GHO register 215 and a phase-interpolated quadrature (four-phase) clock signal, iCKx4, and, based on these inputs, generates update values to be loaded into the rankID-enabled GHO register 215 (i.e., the GHO register for which decoder 217 asserts an enable signal), thus effecting changes in gate hold-off state for the rankID-indicated memory rank.

Still referring to FIG. 3, gate signal generator 205 includes a phase interpolator 231, phase selector 233, hold counter 225 and skip circuit 227 which operate to establish a gate hold-off interval relative to controller-core assertion of the read-data enable signal in accordance with the holdoff value supplied by the hold-off state machine. In the particular embodiment shown, the holdoff value is a composite value or tuple containing multi-bit core-clock count ("holdcount"), phase-mix value ("pmix"), and phase-select value ("psel") that are supplied to the hold counter 225, phase interpolator 233 and phase selector 231, respectively to control gate timing. More specifically, phase interpolator 231 mixes the incoming quadrature core clock phases (CK000, CK090, CK180 and CK270) in accordance with the phase-mix value to generate the phase-interpolated quadrature clock signal, iCKx4, supplying the individual phases thereof (iCK000, iCK090, iCK180 and iCK270) to hold-off state machine 203 (e.g., to the search/tracking logic 209 as described above) and to respective inputs of phase selector 233. Phase interpolator 231 may be implemented by any practicable digital and/or analog phase mixing circuit such that the output phases of the phase-interpolated clock signal are offset from counterpart phases of the quadrature core clock signal by nominal phase angles of pmix*90°/32, where '*' denotes multiplication and "pmix" is a 5-bit component of the holdoff value that ranges from 0 to 31 (higher or lower phase-mixing granularity may be implemented in alternative embodiments). In one embodiment, pmix is implemented as the least significant component of the holdoff value and holdcount as the most significant component so that pmix overflows into (and underflows from) the phase-select value, and the phase-select value similarly overflows into and underflows from the holdcount.

Still referring to FIG. 3, phase selector 233 selects one of the four phase-interpolated clock phases to clock skip circuit 227 with the selected clock phase referred to herein as a "gate clock signal" (gateCK). In one embodiment, skip circuit 227 asserts the gate signal in synchronism with a rising edge of the gate clock signal after delaying for a core-clock interval established by hold counter 225. More specifically, hold counter 225 counts whole (or half or quarter) cycles of the core clock (e.g., marked by rising, falling or rising and falling edges of one of the incoming core clock phases) following assertion of the read data enable signal until a value corresponding to the incoming holdcount value is reached and then asserts a gate-enable signal (enGate) to enable operation of the skip circuit 227, thus establishing the number of core clock cycles that are to transpire between read data enable assertion and gate signal assertion. Upon detecting the gate-enable signal assertion, skip circuit 227 delays until the next rising edge of the gate clock signal (or falling edge, or rising or falling edge, depending upon implementation) and then asserts the gate signal. Reflecting on this operation, gate generator 205 asserts the gate signal after a delay that spans a number of core clock cycles according to the holdcount value and an intra-clock cycle interval according to phase-select and phase-mix values. In the embodiment shown, the seven "phase interpolation" bits collectively allocated to the psel/pmix values resolves the intra-clock cycle interval into 128 phases or phase steps within a core clock cycle to effect a fine delay, while the three-bit holdcount value enables a coarse delay of zero to seven core clock cycles. The specific numbers of bits in any or all of the component values of the overall gate hold-off value ("holdoff") may be increased or decreased in alternative embodiments.

Figure 4:
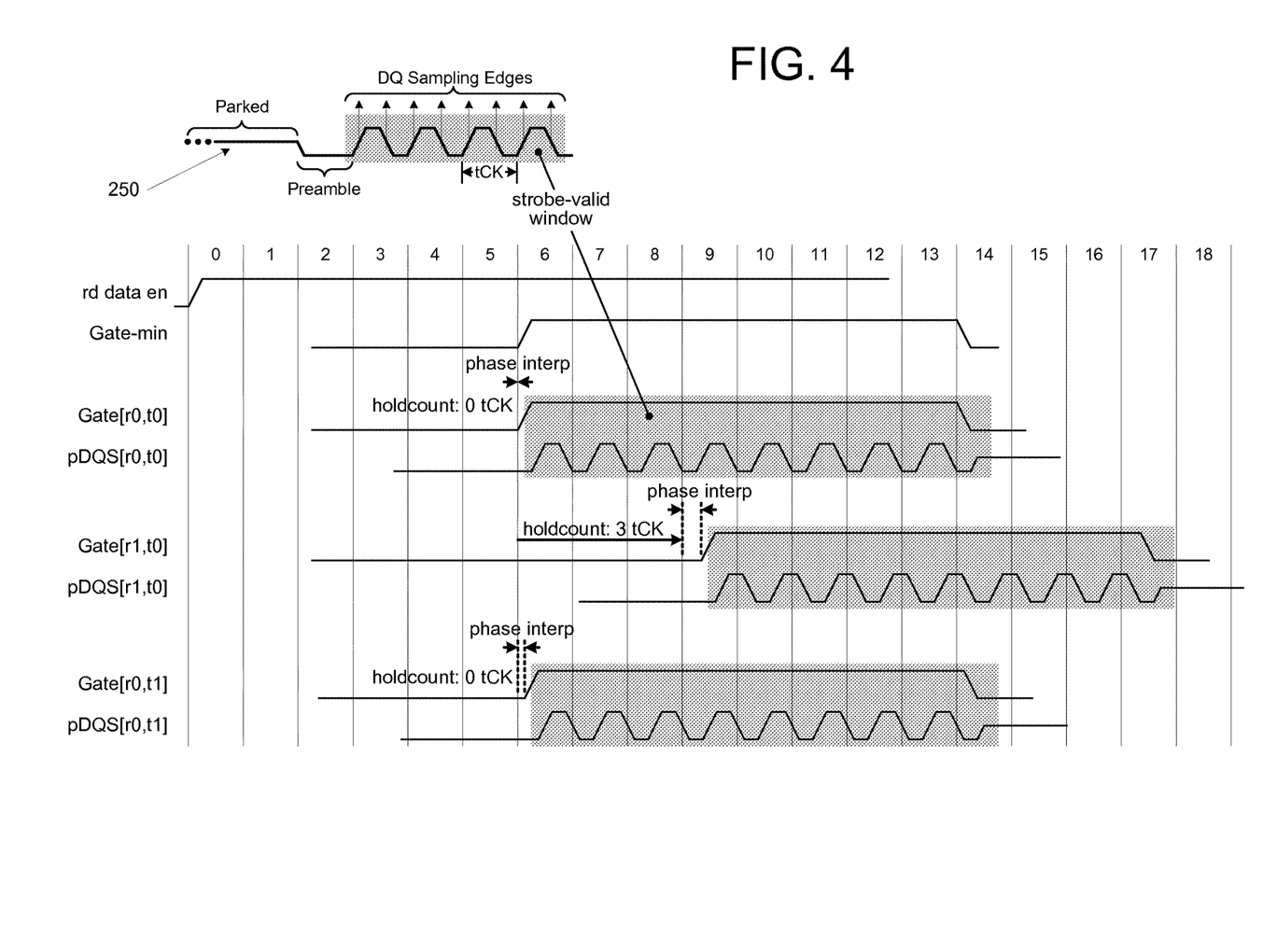
FIG. 4 illustrates exemplary application of the holdcount and phase interpolation components of the gate-hold off value to achieve memory-rank specific and drift-tolerant gate-signal timing.

FIG. 4 illustrates exemplary application of the holdcount and phase interpolation components of the gate-hold off value to achieve memory-rank specific and drift-tolerant gate-signal timing. As shown at 250, an initially parked data strobe is driven low for a single tCK "preamble" interval to signal the impending read data arrival, where 'tCK' refers to the cycle time of the core clock signal. Thereafter, in this double-data-rate example, each rising and falling edge of the strobe signal is applied, directly or indirectly, to time the sampling of a respective incoming read data bit on a given data line. As explained, a single strobe signal may be used to time sampling of read data conveyed on multiple data lines (e.g., in a strobe per byte arrangement, with one strobe line for every eight data lines). In the embodiment shown, the controller core asserts a read enable signal a predetermined time after issuing a memory read request (i.e., at the start of a core clock cycle arbitrarily enumerated as cycle '0' in the example shown) and a predetermined time before a nominal (i.e., design hypothetical) minimum-latency gate signal assertion. In the example presented, a six cycle delay is assumed between read data enable assertion and a nominal minimum-latency gate signal assertion (Gate-min) to provide time for low-latency read data to be received within and propagate through the controller PHY, though longer or shorter delays may apply in alternative embodiments.

Still referring to FIG. 4, timing signal pairs, each including a gate signal (Gate) and pad strobe signal (pDQS), are shown for each of three different read data transactions, a transaction directed to a low-latency memory rank 'r0' at time t0 (designated by "Gate[r0, t0]" and "pDQS[r0, t0]"), a transaction directed to higher-latency memory rank 'r1' at or near that same time t0, and a transaction again directed to low-latency memory rank r0 at a later time t1—a time by which voltage and/or temperature induced timing drift has incurred. As shown, the memory read transaction directed to rank r0 at time t0 corresponds approximately to the nominal minimum-latency timing shown by Gate-min. That is Gate [r0, t0] is asserted with a hold count of zero ("0 tCK") and the phase interpolation effected by the phase mixer and phase selector is zero or nearly so. Though not specifically shown in FIG. 4, assertion of the data valid signal (i.e., from controller PHY to controller core) and corresponding read-FIFO unload operations are carried out at a time corresponding to assertion of Gate[r0, t0] and thus with similarly low latency relative to the worst case read transaction latency. By contrast, the exemplary memory read transaction directed to higher-latency rank r1 (at or near time t0) incurs a 3 tCK hold count, and phase interpolation delay of approximately 0.35 tCK. Similarly, although the memory transaction directed to rank r0 at time t1 (i.e., after voltage/temperature induced timing drift) continues to exhibit the zero-valued hold count, the strobe tracker has adjusted the Gate signal timing, adding approximately 0.18 tCK of delay to account for voltage/temperature induced timing drift in the incoming strobe and data waveforms.

Figure 5:
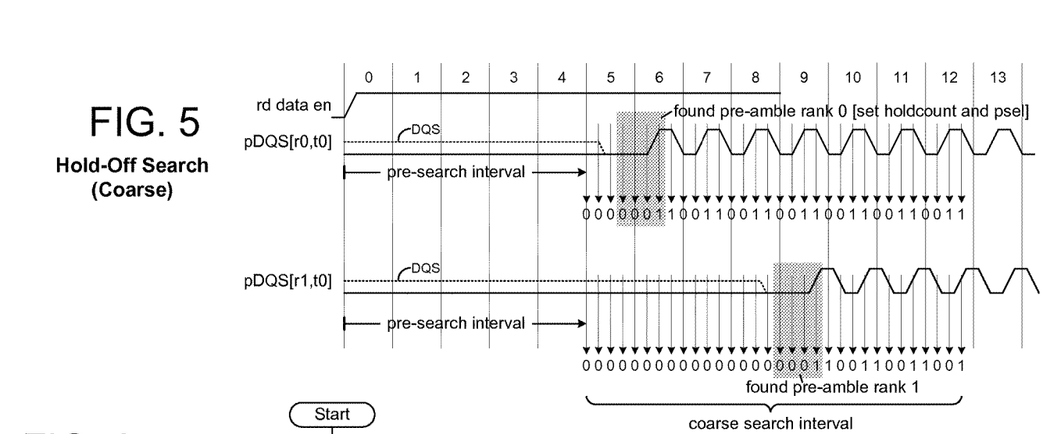
FIGS. 5 and 6 illustrate exemplary coarse and fine hold-off search operations, respectively, that may be carried out within the search/tracking logic of FIG. 3 to calibrate initial gate signal timing and read-FIFO load/unload timing for individual memory ranks.
Figure 6:
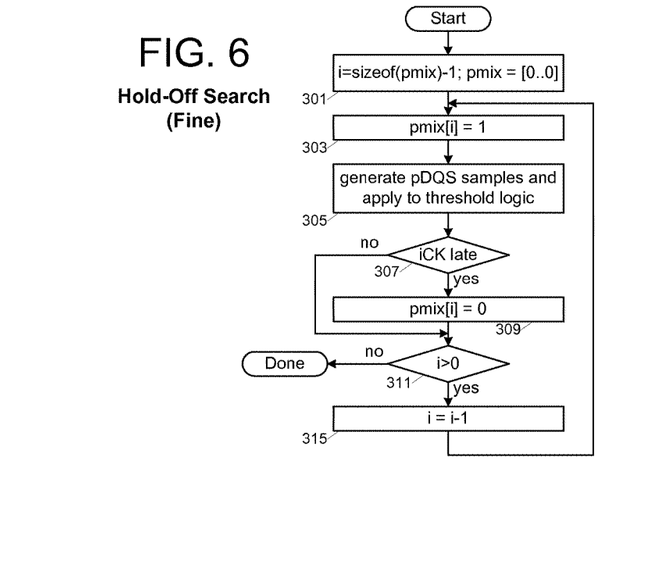

FIGS. 5 and 6 illustrate exemplary coarse and fine holdoff search operations, respectively, that may be carried out within the search/tracking logic 209 of FIG. 3 to calibrate initial gate signal timing and read-FIFO load/unload timing for individual memory ranks. In the coarse hold-off search of FIG. 5, one or more "dummy" read transactions are carried out with respect to each memory rank for the purpose of establishing initial holdcount and quadrature phase select values (e.g., the "holdcount" and "psel" values shown in FIG. 3), thus resolving the gate signal timing to within a quarter clock cycle of the final calibrated value. In the example shown, the parked state of an incoming DQS signal is pulled down to a logic-low state within the corresponding pad strobe signal (pDQS) so that detection of a rising pDQS edge marks the opening of the first data eye (i.e., valid interval) within the incoming read data. Accordingly, after delaying for a pre-search interval that corresponds to a nominal minimum offset between read data enable assertion and the initial rising pDQS edge, the search/tracking logic begins sampling the pDQS waveform in response to transitions of the phase-interpolated quadrature clock signal (which is initially phase aligned with the quadrature core clock phases as the phase-mix value is initially zero), searching for a transition from a logic '0' sample to a logic '1' sample. In one embodiment, the search/tracking logic contains a sufficiently large capture buffer to store samples of the incoming pad strobe signal captured throughout a desired search interval, and thus determine holdcount and psel values following a single dummy read operation. In alternative embodiments having smaller capture buffers, a sequence of two or more dummy read operations may be executed to acquire samples that span respective portions of respective read data reception intervals. In either case, once the initial timing edge is located (e.g., marking the preamble-to-data transition for a given memory rank), sample capture operations (and dummy reads otherwise needed to enable ongoing sample capture) may be terminated.

FIG. 6 illustrates an exemplary fine-resolution hold-off search operation that may be carried out by the search/tracking logic following completion of the coarse search shown in FIG. 5. Starting at 301, a phase-mix value (e.g., "pmix" as described in reference to FIG. 3) is initially cleared to zero (an operation that may have been completed prior to the coarse search described above), and a bit position index, 'i', is initialized to a value corresponding to the most significant bit position within the phase mix value—indicated for example as "i=sizeof(pmix)-1." After these initialization operations are complete, the bit at position T within the phase-mix value, and the thus the most significant bit thereof in the first loop iteration, is set to '1' as shown at 303. At 305, a dummy read operation is carried out and p DQS samples captured to enable a determination of whether the logic '1' phase-mix bit has yielded an early or late interpolated clock signal. More specifically, the pad strobe sample capture is carried out generally as described in reference to FIG. 5, but rather than supplying the captured samples to a transition-detect circuit (e.g., combinatorial logic that generates a hold count and phase select value according to the position of the 0-to-1 transition as shown in FIG. 5), the pad strobe samples are supplied as edge and data samples to an early/late detection circuit that indicates whether a predominant number of the samples indicate that the interpolated clock phase is early relative to timing edges within the pad DQS signal or vice-versa. This operation is discussed in further detail below in connection with drift tracking operation which, in one embodiment, leverages the same or similar early/late detection circuit to increment or decrement the overall holdoff value over time.

Continuing with FIG. 6, if the early/late detection circuit indicates that the interpolated clock phase is late relative to the pDQS edges (i.e., affirmative determination at 307), then bit T of the phase-mix value is cleared at 309. Otherwise, bit T is left in the logic '1' state. The bit position index is evaluated at 311 and, if greater than zero, decremented at 315 so that a repetition of the bit-set, clock-to-pDQS phase-comparison and conditional bit-clear operations effected at 303, 305, 307 and 309 are carried out with respect to the next less-significant bit of the phase-mix value. By this operation, a binary search is executed to calibrate the phase-mix value, with each successive bit being set, a phase-compare tested, and then selectively cleared (or left in the set condition) according to the phase-compare result. After the least-significant bit of the phase-mix value has been tested and selectively cleared/set, as signified by a negative determination at 311, the fine-resolution search is complete, with the phase-mix value and thus the overall holdoff value deemed to be calibrated.

After completion of the initial calibration operation, the search/tracking logic of FIG. 3 carries out a drift tracking function, evaluating the relationship between the interpolated clock phases (iCKx4) with respect to incoming pad strobe signals opportunistically (i.e., when memory read transactions are carried out in the normal course of device operation) and, if memory read traffic fails to meet predetermined minimum transaction density, compulsorily through the initiation of dummy read operations. In one embodiment, for example, a transaction-density monitor within the controller core maintains a count of memory-read transactions issued to a given memory rank over a moving time window, initiating a dummy read if that count falls below a predetermined transaction-density threshold. The transaction-density threshold and time window duration may be programmed within a configuration register or other configuration circuit within the controller core, or may be fixed by design. As one example, the transaction-density threshold may be fixed or programmed to one (1) so that if no memory read-transactions are initiated with respect to the memory rank within a fixed or programmed time window, one or more dummy read operations are initiated by the controller core (e.g., reading from an arbitrary or predetermined memory location). Also, the dummy read operations may serve purposes in addition to the strobe search/tracking operations, including occasional or periodic calibration of signal timing strength/amplitude, equalization coefficients, and so forth.

Figure 7:
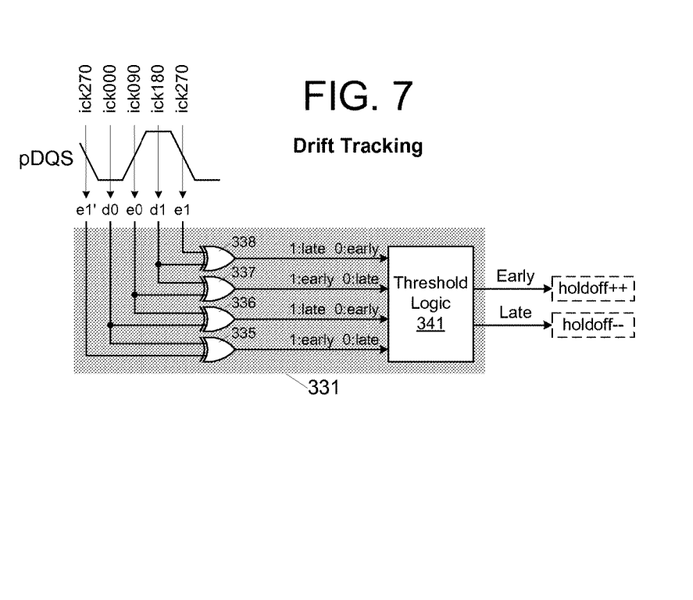
FIG. 7 illustrates an embodiment of an early/late detection circuit that may be included with the search/tracking logic of FIG. 3 to enable opportunistic or compulsory adjustment of the holdoff value for a given memory rank.

FIG. 7 illustrates an embodiment of an early/late detection circuit that may be included with the search/tracking logic 331 of FIG. 3 to enable opportunistic or compulsory adjustment of the holdoff value for a given memory rank, and thus adjustment in response to pad strobe samples captured during a normal-coarse memory read or during a dummy read operation, respectively. As mentioned with respect to FIG. 6, the early/late detection circuit may also be engaged during initial calibration to determine whether the phase-interpolated clock is early or late relative to strobe DQS for respective values of the phase-mix value.

In the embodiment shown, early/late detection circuit 331 comprises a set of exclusive-OR gates 335-338 that compare samples of the pad strobe signal captured in response to respective phases of the phase-interpolated clock during the strobe valid window (i.e., when the pad strobe is transitioning to indicate arrival of memory read data as shown in FIG. 4). As the quadrature phases of the phase-interpolated clock span a cycle of the toggling pad strobe signal (i.e., a tCK interval), the pad strobe samples alternate between edge (transition) and data samples, so that a match between a given edge sample and the following data sample (signaled by a logic '0' output from exclusive-OR gates 335 and 337 indicates that the phase-interpolated clock is late relative to the pad strobe signal, while a mismatch between the edge sample and following data sample (i.e., a logic '1' output from exclusive-OR gates 335 and 337 indicates that the phase-interpolated clock is early relative to the pad strobe signal. Conversely, a match between a given edge sample and the preceding data sample (signaled by a logic '0' output from exclusive-OR gates 336 and 338) indicates that the phase-interpolated clock is early relative to the pad strobe signal, while a mismatch indicates that the phase-interpolated clock is late relative to the pad strobe signal.

In the embodiment of FIG. 7, the early/late outputs of exclusive-OR gates 335-338 are captured over one or more cycles of the phase-interpolated clock (e.g., a number of cycles corresponding to the data burst length and thus the number of data-indicating strobe signal transitions per memory read transaction) by early/late counter elements within threshold logic 341. For example, in one implementation, the outputs of exclusive OR gates 335-338 are combined (e.g., in combinatorial logic) within threshold logic 341 to yield a count up/down value ranging from positive four to negative four, with that count being accumulated in an up/down counter (i.e., "early/late counter"). The net count value accrued within the up/down counter over a given interval (or since the counter was last reset) is supplied to respective upper (early) and lower (late) threshold comparators, with an overthreshold condition detected within either comparator (i.e., count value above a positive early-count threshold or count value below a negative late-count threshold being signaled by assertion of an early signal ("Early") or late signal ("Late"), respectively. In one embodiment, the search/tracker logic applies the Early and Late signals to successively set or clear bits of the phase-mix value during the fine-search calibration operation discussed above, and applies those same signals to increment or decrement the holdoff value for the subject memory rank during drift tracking operation. In the fine-search operation, the threshold values supplied to the upper and lower threshold comparators may be programmed to zero or otherwise reduced relative to the levels applied for drift tracking (i.e., higher thresholds may be applied for drift-tracking purposes to establish a dither-limiting deadband). By this operation, after initially calibrating an estimate of memory read transaction timing, that estimate is adjusted over time (i.e., yielding a running estimate of memory read transaction timing) to account for changes in read-transaction timing due to changes in voltage, temperature or other environmental factors.

Figure 8:
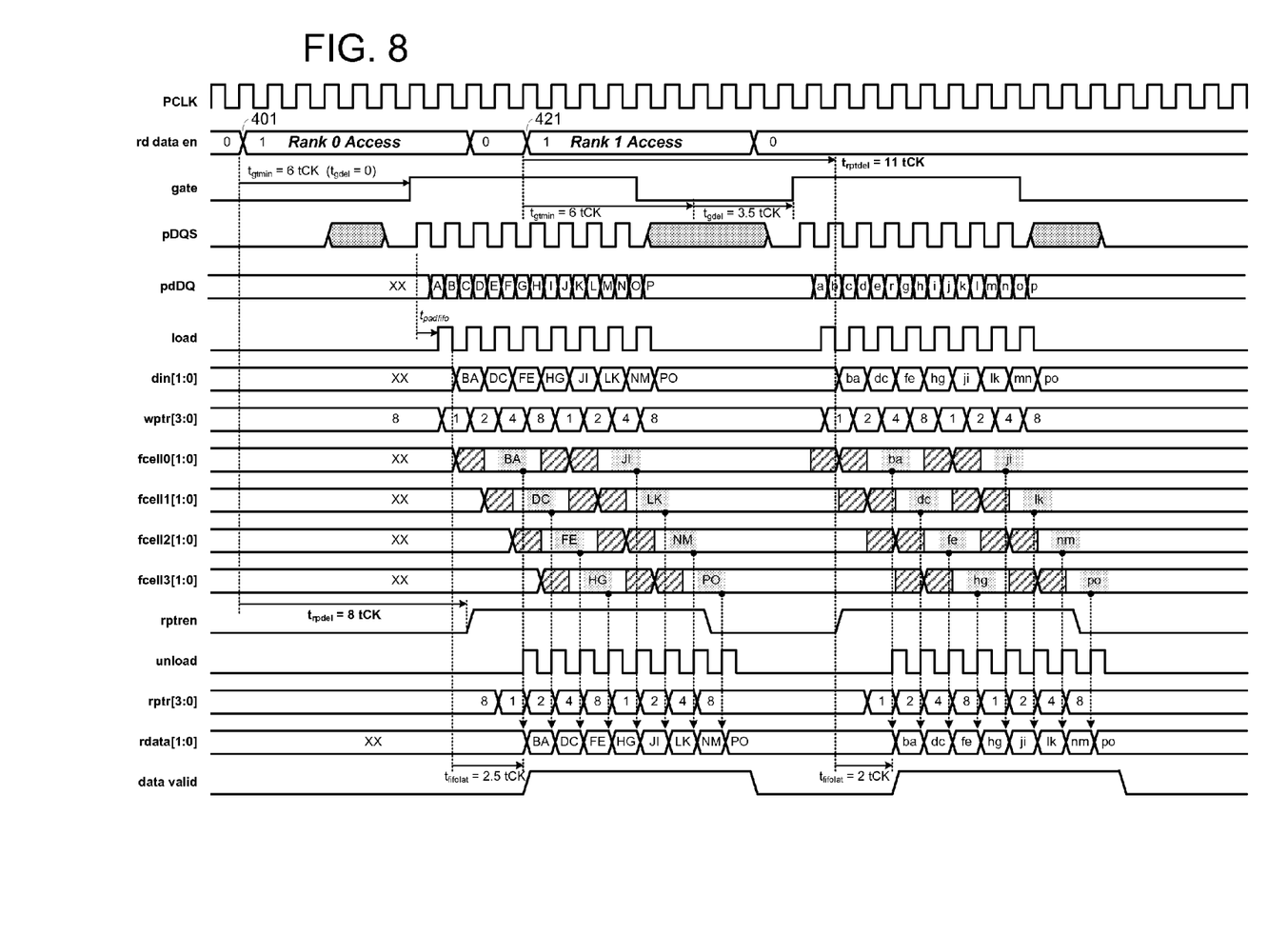
FIG. 8 presents an exemplary timing diagram showing a sequence of memory read transactions, including an initial read transaction directed to a lower-latency memory rank and an ensuing read transaction directed to a higher-latency memory rank.

FIG. 8 presents an exemplary timing diagram showing a sequence of memory read transactions, including an initial read transaction directed to memory rank 0 ("Rank 0 Access") and an ensuing read transaction directed to memory rank 1 ("Rank 1 Access"). In the example shown, memory rank 0 is assumed to exhibit the lower read latency of the two memory ranks with a total delay between assertion of read data enable (marked by the '0' to '1' transition at 401) and gate signal assertion corresponding to a minimum gate delay ($t_{gtmin}$) of six core clock (PCLK) cycles, or 6 tCK. Under this timing arrangement, the delay corresponding to the rank 0 holdoff value (i.e., holdcount plus phase interpolation, shown collectively as "$t_{gtdel}$") is zero.

As shown, the gate signal assertion occurs during a preamble interval of the pad strobe signal (pDQS) and thus shortly before that signal begins toggling to mark the validity of incoming read data. In one embodiment, the read data signal output from the receive buffer/amplifier is delayed by a duration "$t_{padfifo}$" to yield a delayed pad data signal (pdDQ) at the data deserializer input, and the pad strobe signal is similarly delayed by $t_{padfifo}$ to yield the load pulses shown. In the example presented, the deserializer samples the pdDQ signal at each rising and falling load signal edge, yielding a sequence of two-bit data-in values ("din[1:0]") designated with alphanumeric characters corresponding to their bit constituents (e.g., data-in value "BA" includes pdDQ bits 'A' and 'B'). Also, the rising edge of the initial load signal pulse is applied to advance a 4-bit write pointer (wptr[3:0]), rolling that pointer from '1000' to '0001' (or, expressed in decimal form as in FIG. 7, from '8' to '1'). Thereafter, each falling load signal edge enables the two-bit data-in value appearing at the output of the deserializer to be loaded into a two-bit read-FIFO cell corresponding to the write pointer value. Thus, data-in value "BA" is loaded into an initial FIFO cell (fcell0[1:0]) at the falling edge of the first load signal pulse, data-in value "DC" is loaded into a second FIFO cell (fcell1[1:0]) at the falling edge of the second load signal pulse and so forth. As FIG. 8 demonstrates, the FIFO buffering operation extends the data valid time for each data-in value from a single tCK interval to a nominal n*tCK interval, where 'n' corresponds to the FIFO depth (i.e., n=4 in this example). As discussed above, at least one timing uncertainty in the strobe to clock domain crossing relates to the relative phase jitter between the strobe signal and core clock signal, an uncertainty indicated in FIG. 8 by the hashed regions at the leading and trailing edges of the 4tCK data valid intervals within individual FIFO cells. Accordingly, unload pulses are delayed relative to assertion the gate signal (and the load signal pulses) to effect sampling of the FIFO cell contents at a time within the FIFO-cell valid interval after accounting for a worst-case timing jitter. As explained above, the unload signals are generated in the core clock domain (i.e., aligned with edges of the core clock) with each rising edge thereof effecting a transfer from a FIFO cell pointed at by a read pointer value (i.e., rptr[3:0], which is advanced from a final-cell pointer '1000' to an initial-cell pointer '0001' one tCK cycle before the first unload pulse) to a read data buffer within the controller core (rdata[1:0]). As shown, a data valid signal is asserted in synchronism with the rising edge of the initial unload pulse (and lowered following the final unload pulse) to establish, within the core clock domain, a data valid window for the read data being transferred from the controller PHY to the controller core. As shown, a read pointer enable signal is asserted a short time after assertion of the gate signal (2 tCK later in this initial example and thus 8 tCK after read data enable assertion) to enable sequencing of the read pointer through the cells of the read-data FIFO.

Still referring to FIG. 8, reception of read data from memory rank 1 is initiated by assertion of the read data enable signal at 403. For purposes of example, memory rank 1 is assumed to exhibit a higher read-data latency than memory rank 0 with the gate signal being asserted approximately 9.5 tCK after assertion of the read data enable at 403; approximately 3.5 tCK later than the minimum-latency gate signal timing as shown by the 3.5 tCK hold off value (i.e., $t_{gdel}$=3.5 tCK). As in the access to memory rank 1, the load and unload pulse trains are timed relative to the gate signal assertion, thus loading and unloading the read-data FIFO at later times (relative to read data enable assertion) than in the memory rank 0 transaction. In the example shown, the unload pulses are asserted 2 tCK after assertion of the read pointer enable (instead of 2.5 tCK in the memory rank 0 example) as that unload point is more centered within the data valid interval of the individual FIFO cells.

Reflecting on FIG. 8, it can be seen that the read transaction latency perceived by the controller core changes in accordance with the latency of the memory rank being accessed, with the rank-specific, running estimate of the round-trip read transaction time being used not only to assert the gate signal (and thus enable read data reception within the controller PHY), but also to control the timing of the data transfer from the controller PHY to controller core as marked by the unload signal pulses and data valid signal.

Figure 9:
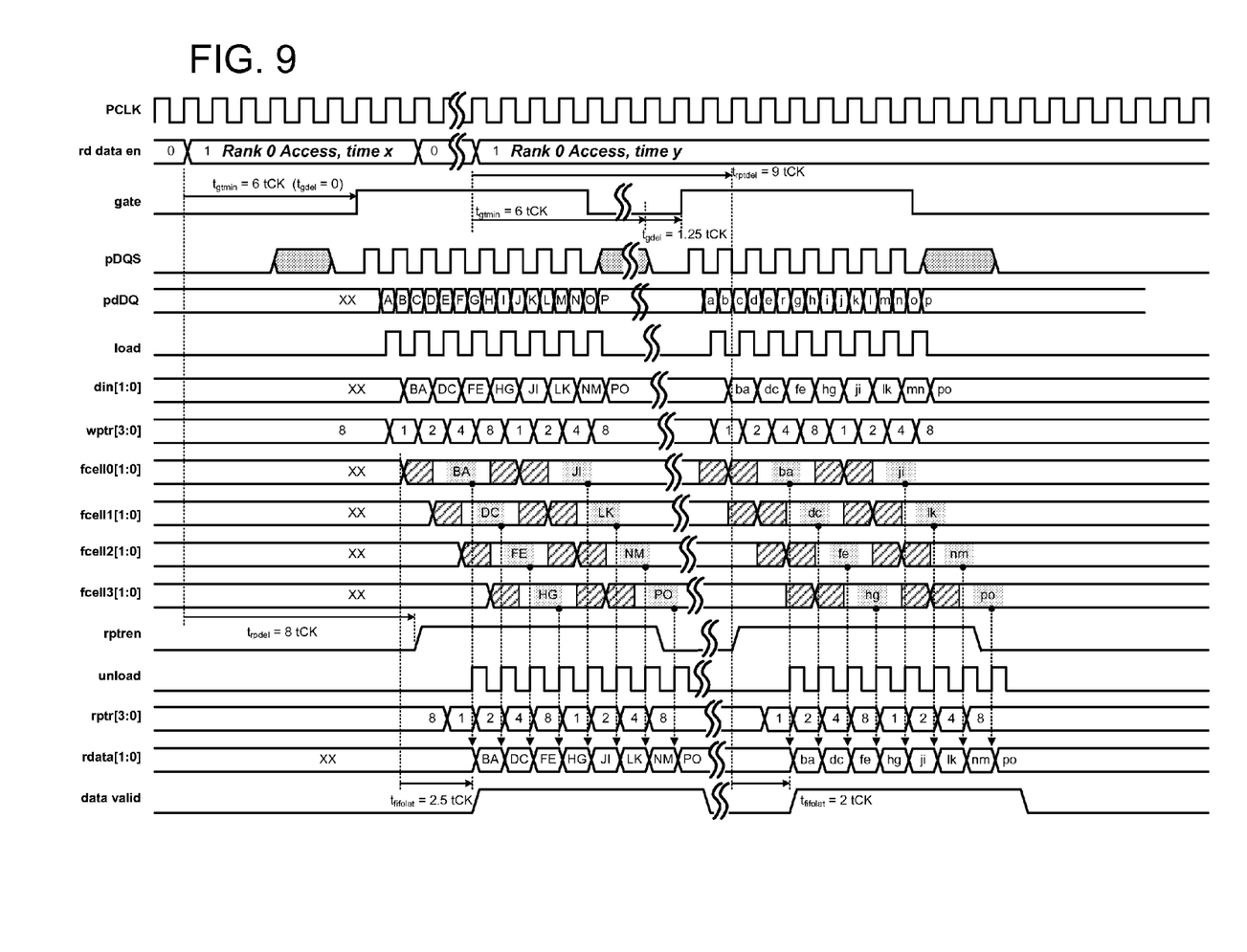
FIG. 9 illustrates exemplary timing diagram comparing the timing of memory read transactions directed to the same memory rank at different times, with the latter transaction executed after read data latency has increased due to changes in voltage and temperature (or other environmental factors).

FIG. 9 illustrates exemplary timing diagram comparing the timing of memory read transactions directed to memory rank 0 at different times, x and y, with the latter transaction executed after read data latency has increased (i.e., drifted due to changes in voltage and temperature) by 1.25tCK. As shown, the initial "time x" read data reception occurs with the same timing described in reference to the memory 0 read data reception described in reference to FIG. 8. By contrast, the 1.25 tCK timing drift in the "time y" read data reception results in a correspondingly more latent gate signal assertion (i.e., $t_{gdel}$ has increased from zero to 1.25 tCK) and thus correspondingly more latent FIFO load and unload operations. As in the memory rank 1 example above, the FIFO unload point occurs with a 2 tCK latency relative to the read pointer enable assertion as that unload timing is more centered within the data valid window of the individual FIFO cells. In any event, the overall read transaction latency perceived by the controller core increases and decreases according to temperature/voltage-induced increases and decreases in the data capture time (i.e., relative to initiation of a memory read transaction) within the controller PHY.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied in combination with any other of the embodiments or in place of counterpart features or aspects thereof. Accordingly, the specification and drawings are to be regarded in an illustrative rather than a restrictive sense.

What is claimed is:

1. A method of operation within a memory controller having a controller core and a physical signaling interface, the method comprising:
    outputting a request for read data from the controller core to the physical signaling interface, the request for read data specifying one of at least two memory components from which the read data is to be retrieved;
    outputting a memory read request from the physical signaling interface to the one of at least two memory components in accordance with the request for read data;
    receiving the read data via the physical signaling interface following output of the memory read request; and
    transferring the read data from the physical signaling interface to the controller core at either a first time or a second time according to whether the one of at least two memory components specified in the request for read data is a first memory component of the at least two memory components or a second memory component of the at least two memory components.

2. The method of claim 1 wherein receiving the read data via the signaling interface comprises receiving the read data in response to transitions of a strobe signal output by the one of at least two memory components, and wherein transferring the read data from the physical signaling interface to the controller core comprises transferring the read data to the controller core at times indicated by transitions of a clock signal, the clock signal defining a clock domain within the controller core that is mesochronous with respect to a timing domain defined by transitions of the strobe signal.

3. The method of claim 1 wherein each memory component of the least two memory components is a component of a respective rank of two or more memory components.

4. The method of claim 1 wherein transferring the read data from the physical signaling interface to the controller core at either a first time or a second time comprises determining a first estimated time of arrival within the physical signaling interface for read data received from the first memory component and a second estimated time of arrival within the physical signaling interface for read data received from the second memory component.

5. The method of claim 4 wherein transferring the read data from the physical signaling interface to the controller core at either the first time or the second time further comprises transferring the read data from the physical signaling interface to the controller at a time, based at least in part, on either the first estimated time or the second estimated time according to whether the one of at least two memory components specified in the request for read data is the first memory component or the second memory component.

6. The method of claim 4 further comprising determining a time of arrival of the read data within the physical signaling interface and updating either the first estimated time or the second estimated time according to whether the one of at least two memory components specified in the request for read data is the first memory component or the second memory component.

7. The method of claim 6 wherein determining the time of arrival of the read data within the physical signaling interface comprises determining an elapsed time between the time of arrival of the read data within the physical signaling interface and receipt within the physical signaling interface of one or more signals from the controller core corresponding to the request for read data.

8. The method of claim 4 wherein determining the first estimated time of arrival within the signaling interface for read data received from the first memory component comprises adjusting the first estimated time of arrival in response to timing determinations made for each of a sequence of memory read transactions executed with respect to the first memory component.

9. The method of claim 8 wherein at least one memory read transaction of the sequence of memory read transactions is a dummy read transaction.

10. The method of claim 4 wherein determining the first estimated time of arrival comprises issuing one or more dummy read requests to the first memory component and determining respective times of arrival, within the physical signaling interface, of read data corresponding to the one or more dummy read requests.

11. A memory controller component comprising:
a controller core to output a request for read data, the request for read data specifying one of at least two memory components from which the read data is to be retrieved;
a physical signaling interface to:
receive the request for read data from the controller core,
output a memory read request to the specified one of at least two memory components,
receive the read data following output of the memory read request, and
transfer the read data to the controller core at either a first time or a second time according to whether the specified one of at least two memory components is a first memory component of the at least two memory components or a second memory component of the at least two memory components.

12. The memory controller component of claim 11 wherein the physical signaling interface to receive the read data and transfer the read data to the controller core comprises circuitry to receive the read data in response to transitions of a strobe signal output by the specified one of at least two memory components and to transfer the read data to the controller core at times indicated by transitions of a clock signal, the clock signal defining a clock domain within the controller core that is mesochronous with respect to a timing domain defined by transitions of the strobe signal.

13. The memory controller component of claim 11 wherein each memory component of the least two memory components is a component of a respective rank of two or more memory components.

14. The memory controller component of claim 11 wherein the physical signaling interface to transfer the read data to the controller core at either a first time or a second time comprises circuitry to determine a first estimated time of arrival within the physical signaling interface for read data received from the first memory component and a second estimated time of arrival within the physical signaling interface for read data received from the second memory component.

15. The memory controller component of claim 14 wherein the physical signaling interface to transfer the read data to the controller core at either the first time or the second time further comprises circuitry to transfer the read data to the controller at a time, based at least in part, on either the first estimated time or the second estimated time according to whether the specified one of at least two memory components is the first memory component or the second memory component.

16. The memory controller component of claim 14 wherein the circuitry to determine the first estimated time of arrival comprises circuitry to (i) determine a time of arrival of the read data within the physical signaling interface and (ii) update either the first estimated time or the second estimated time according to whether the specified one of at least two memory components is the first memory component or the second memory component.

17. The memory controller component of claim 16 wherein the circuitry to determine the time of arrival of the read data within the physical signaling interface comprises circuitry to determine an elapsed time between the time of arrival of the read data within the physical signaling interface and receipt of one or more signals from the controller core corresponding to the request for read data.

18. The memory controller component of claim 14 wherein the circuitry to determine the first estimated time of arrival comprises circuitry to adjust the first estimated time of arrival in response to timing determinations made for each of a sequence of memory read transactions executed with respect to the first memory component.

19. The memory controller component of claim 14 wherein the physical signaling face is further to issue one or more dummy read requests to the first memory component and the circuitry to determine the first estimated time of arrival comprises circuitry determine respective times of arrival of read data corresponding to the one or more dummy read requests.

20. A memory controller component having a controller core and a physical signaling interface, the memory controller comprising:
means for outputting a request for read data from the controller core to the physical signaling interface, the request for read data specifying one of at least two memory components from which the read data is to be retrieved;

means for outputting a memory read request from the physical signaling interface to the one of at least two memory components in accordance with the request for read data;

means for receiving the read data via the physical signaling interface following output of the memory read request; and means for transferring the read data from the physical signaling interface to the controller core at either a first time or a second time according to whether the one of at least two memory components specified in the request for read data is a first memory component of the at least two memory components or a second memory component of the at least two memory components.

* * * * *